United States Patent
Inomata (10) Patent No.: US 10,096,676 B2
(45) Date of Patent: Oct. 9, 2018

(54) SEMICONDUCTOR DEVICE AND MANUFACTURING METHOD THEREOF

(71) Applicant: Renesas Electronics Corporation, Tokyo (JP)

(72) Inventor: Hisao Inomata, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/652,389

(22) Filed: Jul. 18, 2017

(65) Prior Publication Data

US 2018/0076286 A1 Mar. 15, 2018

(30) Foreign Application Priority Data

Sep. 14, 2016 (JP) .................. 2016-179281

(51) Int. Cl.
| | |
|---|---|
| H01L 29/66 | (2006.01) |
| H01L 29/10 | (2006.01) |
| H01L 21/04 | (2006.01) |
| H01L 21/265 | (2006.01) |
| H01L 21/28 | (2006.01) |

(Continued)

(52) U.S. Cl.
CPC ........ *H01L 29/1058* (2013.01); *H01L 21/047* (2013.01); *H01L 21/049* (2013.01); *H01L 21/266* (2013.01); *H01L 21/26546* (2013.01); *H01L 21/26586* (2013.01); *H01L 21/28264* (2013.01); *H01L 21/3215* (2013.01); *H01L 21/32055* (2013.01); *H01L 29/1608* (2013.01); *H01L 29/2003* (2013.01);
(Continued)

(58) Field of Classification Search
CPC ........... H01L 29/1058; H01L 21/32055; H01L 29/66068; H01L 29/8083; H01L 21/266; H01L 29/2003; H01L 29/1608; H01L 29/66924; H01L 21/3215; H01L 21/28264; H01L 21/049; H01L 21/26586; H01L 21/26546; H01L 21/047; H01L 29/66909
See application file for complete search history.

(56) References Cited

U.S. PATENT DOCUMENTS 8,436,397 B2    5/2013  Shimizu et al.
9,508,803 B2 *  11/2016 Nakano ............... H01L 29/7813

FOREIGN PATENT DOCUMENTS

JP       2010-147405 A    7/2010

* cited by examiner

*Primary Examiner* — David Vu
(74) *Attorney, Agent, or Firm* — McGinn IP Law Group, PLLC.

(57) ABSTRACT

A semiconductor device includes: a first-conductivity-type semiconductor substrate serving as a drain layer; a first-conductivity-type epitaxial layer formed on the semiconductor substrate; a first-conductivity-type source layer formed in a surface part of the epitaxial layer; two second-conductivity-type gate layers formed in the surface part of the epitaxial layer so as to sandwich the source layer; a first-conductivity-type channel forming layer formed so as to be sandwiched between the two gate layers, the first-conductivity-type channel forming layer being formed on an inner side of the source layer in the epitaxial layer; and an electrode connected to one of the drain layer, the source layer, and the gate layer. In the channel forming layer, two first-conductivity-type impurity layers each having a substantially predetermined width are formed adjacent to each other in a direction crossing a channel.

2 Claims, 6 Drawing Sheets

(51) Int. Cl.
    *H01L 21/3215*     (2006.01)
    *H01L 21/3205*     (2006.01)
    *H01L 29/16*     (2006.01)
    *H01L 29/20*     (2006.01)
    *H01L 21/266*     (2006.01)
    *H01L 29/808*     (2006.01)

(52) U.S. Cl.
    CPC .. *H01L 29/66068* (2013.01); *H01L 29/66909* (2013.01); *H01L 29/66924* (2013.01); *H01L 29/8083* (2013.01)

SEMICONDUCTOR DEVICE AND MANUFACTURING METHOD THEREOF

CROSS-REFERENCE TO RELATED APPLICATIONS

This application is based upon and claims the benefit of priority from Japanese patent application No. 2016-179281, filed on Sep. 14, 2016, the disclosure of which is incorporated herein in its entirety by reference.

BACKGROUND

The present invention relates to a semiconductor device and a manufacturing method of a semiconductor device.

As a semiconductor power element, a junction FET (Field Effect Transistor) has been developed in which a pn junction is formed between a channel forming layer and a gate layer and the width of a depletion layer extending from the pn junction is controlled to thereby turn on or off a channel. For example, Japanese Unexamined Patent Application Publication No. 2010-147405 discloses a vertical type junction FET using silicon carbide for a substrate and an epitaxial layer, in which an impurity concentration in a part of a channel forming layer that forms a pn junction with a gate layer is set to be higher than the impurity concentration in a central part of the channel forming layer and the epitaxial layer, thereby achieving both an improvement in source-drain breakdown voltage and a reduction in on-resistance.

SUMMARY

In the junction FET disclosed in Japanese Unexamined Patent Application Publication No. 2010-147405, as described below, the channel width in which a predetermined source-drain breakdown voltage and a predetermined on-resistance can be obtained is narrow, so that element characteristics may vary depending on process variations during a manufacturing process.

Under such circumstances, there is a demand for a semiconductor device and a manufacturing method of a semiconductor device which can easily obtain a predetermined source-drain breakdown voltage and a predetermined on-resistance even when process variations occur during a manufacturing process.

Other problems to be solved by and novel features of the present invention become apparent from the following description and the accompanying drawings.

According to one embodiment, a semiconductor device includes: a first-conductivity-type semiconductor substrate serving as a drain layer; a first-conductivity-type epitaxial layer formed on the semiconductor substrate; a first-conductivity-type source layer formed in a surface part of the epitaxial layer; two second-conductivity-type gate layers formed in the surface part of the epitaxial layer so as to sandwich the source layer; a first-conductivity-type channel forming layer formed so as to be sandwiched between the two gate layers, the first-conductivity-type channel forming layer being formed on an inner side of the source layer in the epitaxial layer; and an electrode connected to one of the drain layer, the source layer, and the gate layer. In the channel forming layer, two first-conductivity-type impurity layers each having a substantially predetermined width are formed adjacent to each other in a direction crossing a channel.

According to another embodiment, a manufacturing method of a semiconductor device includes: forming a first-conductivity-type epitaxial layer on a first-conductivity-type semiconductor substrate serving as a drain layer; forming a first-conductivity-type impurity layer in a surface part of the epitaxial layer; forming, on the impurity layer, a mask having openings at positions corresponding to two regions sandwiching a region serving as the source layer, the mask covering the region serving as the source layer; forming two adjacent first-conductivity-type impurity layers in the epitaxial layer by performing oblique ion implantation of a first-conductivity-type impurity from two opposite directions via the mask; forming two second-conductivity-type gate layers in the impurity layer or the epitaxial layer by performing vertical ion implantation of a second-conductivity-type impurity via the mask; removing the mask; and forming a plurality of electrodes to be connected to the drain layer, the source layer, and the gate layer, respectively.

According to the above embodiments, it is possible to provide a semiconductor device and a manufacturing method of a semiconductor device which can easily obtain a predetermined source-drain breakdown voltage and a predetermined on-resistance even when process variations occur during a manufacturing process.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

For clarity of explanation, the following description and the drawings are abbreviated or simplified as appropriate. The same components are denoted by the same reference numerals throughout the drawings, and repeated descriptions thereof are omitted as appropriate. For clarity of illustration in the drawings, hatching and the like for sections may be omitted.

A semiconductor device and a manufacturing method of the semiconductor device according to this embodiment relate to a junction FET having a configuration in which impurity layers each having a substantially predetermined width and the same conductivity type as that of a channel forming layer are formed adjacent to each other in the channel forming layer. With this configuration, the impurity concentration in the channel forming layer is ensured and a predetermined source-drain breakdown voltage and a predetermined on-resistance can be easily obtained even when the channel width varies due to process variations occurring during a manufacturing process.

The semiconductor device according to this embodiment can be used for, for example, a motor driving inverter mounted on an electric vehicle, in place of an IGBT or the like using a silicon substrate.

First, the configuration of the junction FET of the semiconductor device according to this embodiment will be described. As for the entire configuration of the semiconductor device (or semiconductor chip), for example, Japanese Unexamined Patent Application Publication No. 2010-147405 can be referred to.

Figure 1:
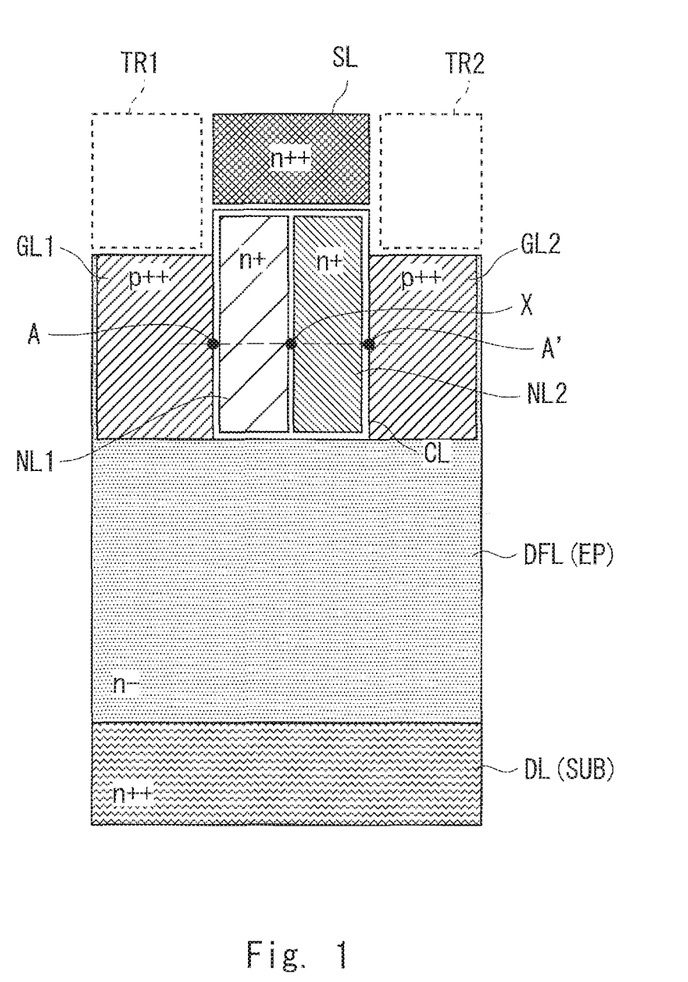
FIG. 1 is a sectional view showing a configuration of a junction FET according to an embodiment.

FIG. 1 is a sectional view showing the configuration of the junction FET according to this embodiment.

An epitaxial layer EP serving as a drift layer DFL is formed on a semiconductor substrate SUB serving as a drain layer DL. As a material of the semiconductor substrate SUB and the epitaxial layer EP, a material obtained by implanting an n-type impurity in silicon carbide is used. At this time, the impurity concentration of the n-type impurity of the epitaxial layer EP is smaller than the impurity concentration of the n-type impurity of the semiconductor substrate SUB. The silicon carbide substrate has a band gap larger than that of the silicon substrate, and thus a source-drain breakdown voltage in the silicon carbide substrate can be increased more than that in the silicon substrate.

Further, a plurality of trenches TR1 and TR2 are formed in the surface of the epitaxial layer EP, and a source layer SL is formed in a surface part of the epitaxial layer EP sandwiched between the adjacent trenches TR1 and TR2. The source layer SL is formed by implanting an n-type impurity with a concentration higher than that of the epitaxial layer EP in the surface part of the epitaxial layer EP. A source electrode (not shown) which is electrically connected to the source layer SL is formed on the source layer SL.

Gate layers GL1 and GL2 are formed below bottom surfaces of the trenches TR1 and TR2, respectively. The gate layers GL1 and GL2 are formed by implanting a p-type impurity into the surface part of the epitaxial layer EP.

Below the source layer SL, the epitaxial layer EP which is sandwiched by the adjacent trenches TR1 and TR2 and the gate layers GL1 and GL2 functions as a channel forming layer CL.

On the surface of the epitaxial layer EP above which the trenches TR1 and TR2 and the source layer SL are formed, multilayer interconnection, such as an aluminum wire, is formed with an interlayer dielectric interposed therebetween. The source layer SL is electrically connected to a source pad via the source electrode, and the gate layer GL is electrically connected to a gate pad via a gate electrode. The drain layer DL is electrically connected to a drain pad via a drain electrode (which are not shown).

In the junction FET according to this embodiment, n-type semiconductor layers NL1 and NL2 each having a substantially predetermined width are formed adjacent to each other in a direction crossing a channel in the channel forming layer CL. The impurity concentration in each of the semiconductor layers NL1 and NL2 is larger than the impurity concentration in the epitaxial layer EP.

In the junction FET according to this embodiment, the semiconductor layers NL1 and NL2 are formed so as to ensure a certain impurity concentration or more in the channel forming layer CL even when the interval between the adjacent trenches TR1 and TR2 or between the adjacent gate layers GL1 and GL2, i.e., the channel width, varies due to process variations.

Note that in FIG. 1, gaps are formed between the gate layer GL1 and the n-type semiconductor layer NL1, between the gate layer GL2 and the n-type semiconductor layer NL2, and between the n-type semiconductor layers NL1 and NL2, for clarity of illustration. However, the actual junction FET has no such gaps.

Figure 2:
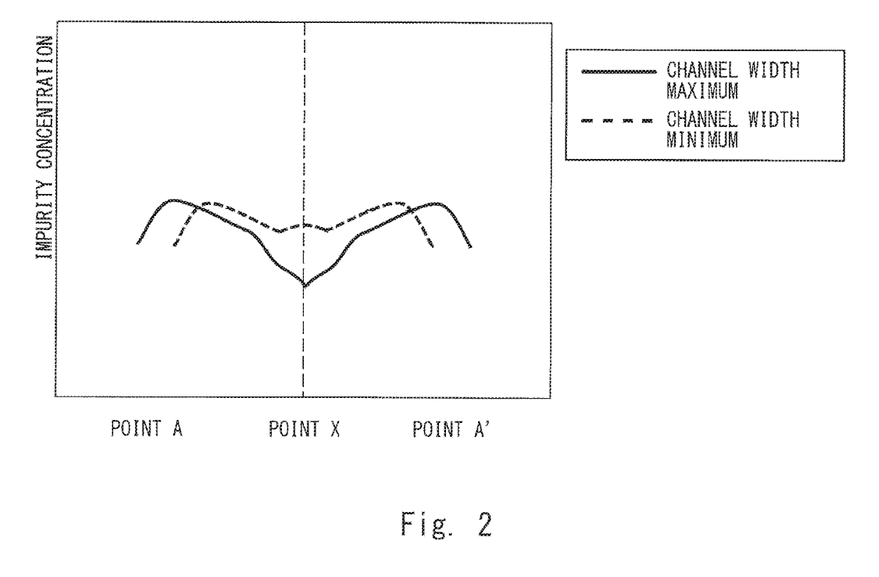
FIG. 2 is a graph showing an effective concentration distribution of an n-type impurity in a channel forming layer according to the embodiment.

FIG. 2 is a graph showing an effective concentration distribution of an n-type impurity in the channel forming layer CL according to this embodiment. FIG. 2 shows a concentration distribution in a part corresponding to an interval between points A and A' shown in FIG. 1, and right and left ends of the graph (a solid line or a broken line) correspond to the points A and A', respectively.

Note that the point A shown in FIG. 1 is a point on the boundary between the semiconductor layer NL1 (or the channel forming layer CL) and the gate layer GL1, and the point A' is a point on the boundary between the semiconductor layer NL2 (or the channel forming layer CL) and the gate layer GL2. The length (distance) between the point A and the point A' corresponds to the channel width.

In both cases where the channel width is maximum (solid line) and the channel width is minimum (broken line), there are effective impurity concentration peaks in the channel forming layer CL in the vicinity of the pn junction between the gate layer GL and the channel forming layer CL.

When the channel width is maximum, the impurity concentration gradually approaches the impurity concentration in the epitaxial layer EP toward a midpoint X of the channel forming layer CL. In this case, however, the semiconductor layers NL1 and NL2 are configured to be in contact with each other.

When the channel width is minimum, the semiconductor layers NL1 and NL2 partially overlap each other, and the impurity concentration in the vicinity of the midpoint X of the channel forming layer CL is larger than that in peripheral parts of the midpoint X. With this configuration, even if the channel width is small, an increase of on-resistance can be suppressed, and both an improvement in the source-drain breakdown voltage and a reduction in on-resistance can be achieved.

Figure 3:
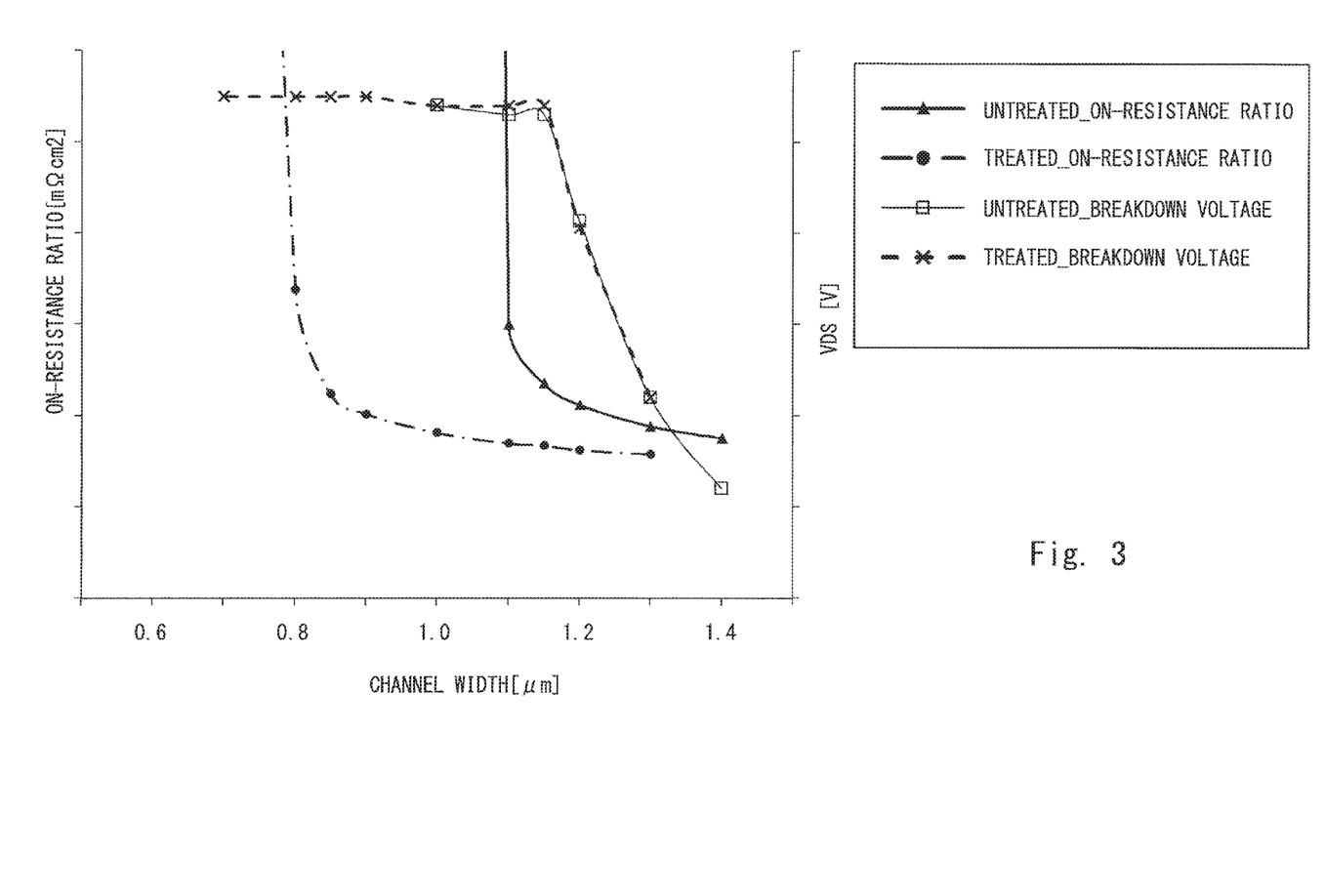
FIG. 3 is a graph showing a relationship between a channel width and an on-resistance ratio or a source-drain breakdown voltage according to the embodiment.

FIG. 3 is a graph showing relationships between a channel width and an on-resistance ratio, and between a channel width and a source-drain breakdown voltage (VDS) according to this embodiment. A comparative example illustrates relationships between a channel width and an on-resistance ratio, and between a channel width and a source-drain breakdown voltage of a junction FET for which no countermeasures are taken, such as a junction FET disclosed in Japanese Unexamined Patent Application Publication No. 2010-147405. The horizontal axis represents the channel width, and the vertical axis represents the on-resistance ratio or source-drain breakdown voltage.

In the junction FET for which no countermeasures are taken, the on-resistance ratio increases when the channel width is 1.15 μm or less, and the source-drain breakdown voltage decreases when the channel width is 1.15 μm or more. The range of the channel width in which a predetermined source-drain breakdown voltage and a predetermined on-resistance can be obtained is extremely narrow.

On the other hand, in the junction FET for which countermeasures are taken according to this embodiment, the source-drain breakdown voltage also decreases when the channel width is 1.15 μm or more, while the on-resistance ratio increases when the channel width is 0.90 μm or less.

Thus, the range of the channel width in which a predetermined source-drain breakdown voltage and a predetermined on-resistance can be obtained is increased to 0.25 μm.

Impurities having the same conductivity type overlap in a central part of the channel forming layer CL for forming two adjacent impurity layers in the channel forming layer CL by performing oblique ion implantation from two opposite directions. For that reason, a low-resistance part where a current is easily to flow is formed in a central part of the channel forming layer CL, so that an increase of the on-resistance when the channel width is narrowed is cancelled out.

For example, in the case of simply increasing the impurity concentration in the entire channel forming layer, the range of the channel width in which a predetermined source-drain breakdown voltage and a predetermined on-resistance can be obtained is reduced, so that element characteristics are more easily to be affected by process variations. However, when the impurity concentration in a part of the channel forming layer CL is increased like in the junction FET according to this embodiment, the range of the channel width in which a predetermined source-drain breakdown voltage and a predetermined on-resistance can be obtained is about seven times as wide as that in the junction FET for which no countermeasures are taken, so that small process variations during a manufacturing process can be sufficiently absorbed.

Next, a manufacturing method of the semiconductor device according to this embodiment will be described based on characteristics steps for manufacturing the junction FET. As for detailed processing conditions for each step and processing contents of the other steps for manufacturing the semiconductor device, for example, Japanese Unexamined Patent Application Publication No. 2010-147405 can be referred to.

Figure 4:
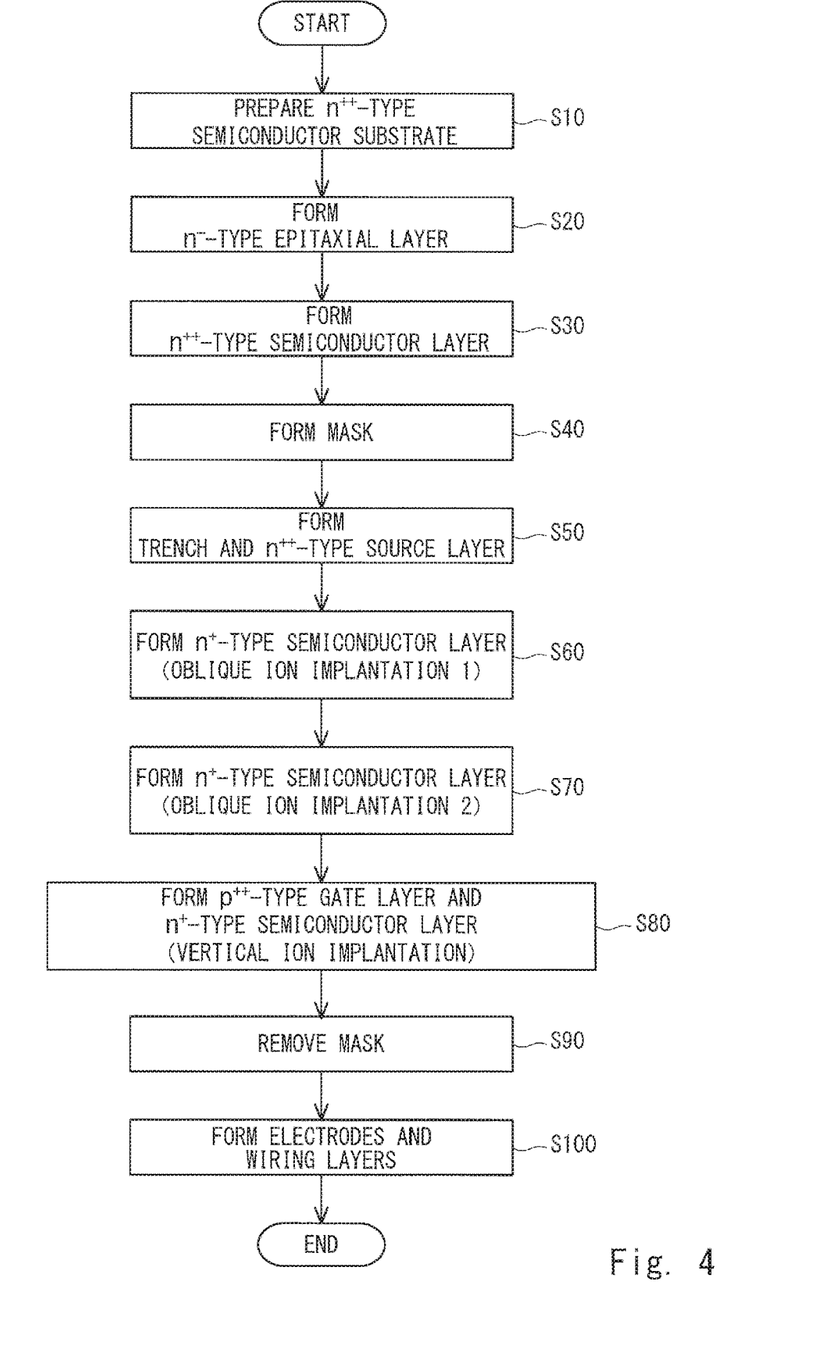
FIG. 4 is a flowchart showing a process procedure of a manufacturing method of a semiconductor device according to the embodiment.

FIG. 4 is a flowchart showing a process procedure of the manufacturing method of the semiconductor device according to this embodiment. FIGS. 5 to 8 are sectional views each showing a manufacturing step of the semiconductor device according to this embodiment.

When the manufacturing method of the semiconductor device is started, the $n^{++}$-type semiconductor substrate SUB is first prepared (step S10).

Next, the $n^-$-type epitaxial layer EP is grown on the semiconductor substrate SUB (step S20).

Next, on the surface of the epitaxial layer EP, an $n^{++}$-type semiconductor layer BSL, which becomes the source layer SL later, is formed by ion implantation (step S30).

Next, an oxide film and a polysilicon film are grown on the semiconductor layer BSL. A part of these films is removed by a photolithography technique. Then a mask MA is formed which covers a region which becomes the source layer SL later and has openings at positions corresponding to regions which become the trenches TR (or the gate layers GL) later (step S40).

Figure 5:
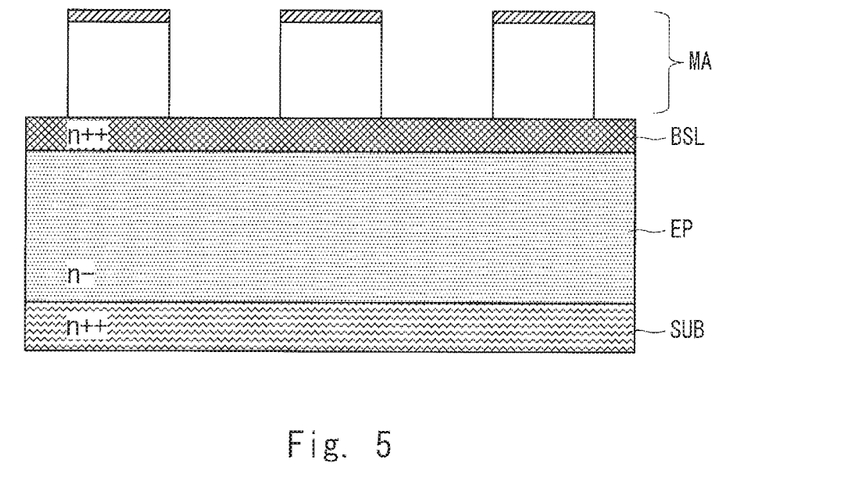
FIG. 5 is a sectional view showing a manufacturing step of the semiconductor device according to the embodiment.

FIG. 5 is a process sectional view after the mask MA according to this embodiment is formed.

Next, the trench TR is formed by a dry etching technique using the mask MA (step S50). The trench TR penetrates the semiconductor layer BSL and reaches the inside of the epitaxial layer EP. At this time, the semiconductor layer BSL which is left below the mask MA serves as the $n^{++}$-type source layer SL.

Next, an oblique ion implantation is performed from one direction of the mask MA, to thereby form an n+ semiconductor layer BNL2 which becomes the semiconductor layer NL2 later (step S60).

Figure 6:
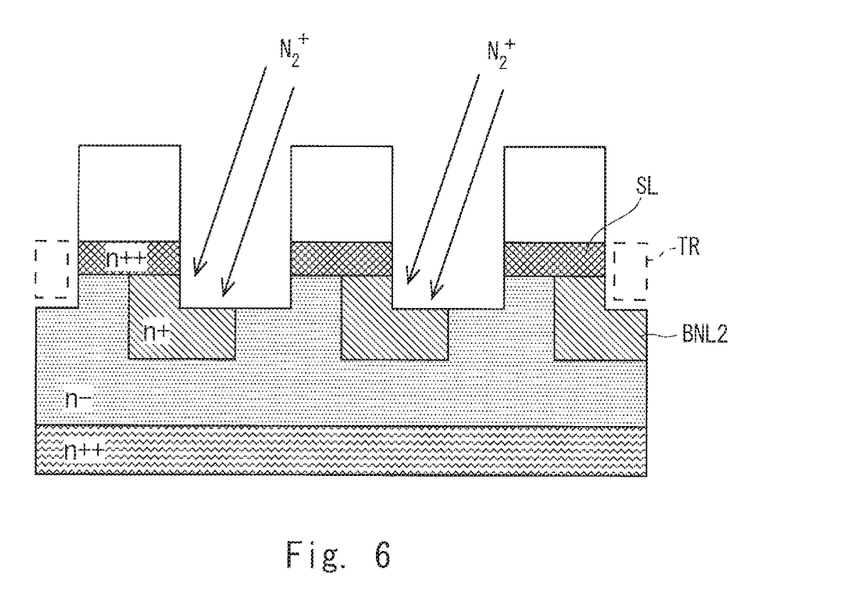
FIG. 6 is a sectional view showing a manufacturing step of the semiconductor device according to the embodiment.

FIG. 6 is a process sectional view when a first oblique ion implantation for forming the $n^+$ semiconductor layer BNL2 according to this embodiment is performed.

In this ion implantation, ions are implanted from an upper right direction to a lower left direction in the figure. Nitrogen N2+ is used as ionic species. The implantation energy is 600 keV. The dosage of ions is 1.1 E13/cm$^2$. The implantation angle is 25 degrees. As a result, the $n^+$ semiconductor layer BNL2 can be formed in a part of the epitaxial layer EP that corresponds to the right half of the source layer SL and in a part of the epitaxial layer EP that corresponds to the left half of the bottom surface of the trench TR.

Next, an oblique ion implantation is performed from another direction of the mask MA, to thereby form an $n^+$ semiconductor layer BNL1 which becomes the semiconductor layer NL1 later (step S70).

Figure 7:
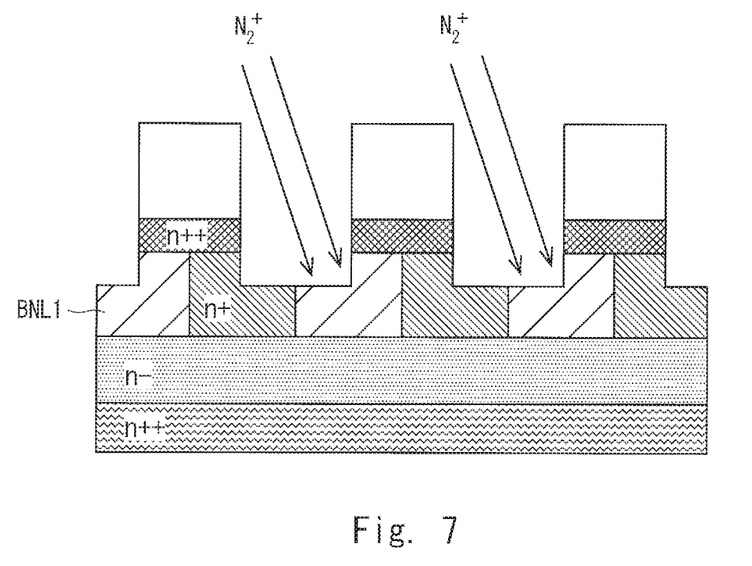
FIG. 7 is a sectional view showing a manufacturing step of the semiconductor device according to the embodiment.

FIG. 7 is a process sectional view when a second oblique ion implantation for forming the $n^+$ semiconductor layer BNL1 according to this embodiment is performed.

In this ion implantation, ions are implanted from an upper left direction to a lower right direction in the figure. The implantation conditions may be similar to those for forming the $n^+$ semiconductor layer BNL2, except for the direction of the ion implantation. As a result, the $n^+$ semiconductor layer BNL1 can be formed in a part of the epitaxial layer EP that corresponds to the remaining half (left half) of the source layer SL and in a part of the epitaxial layer EP that corresponds to the remaining half (right half) of the bottom surface of the trench TR.

Next, the $p^{++}$-type gate layer GL is formed by a vertical ion implantation using the mask MA as it is (step S80). The gate layer GL is formed by implanting p-type ions, such as Al$^+$, into the $n^+$ semiconductor layers BNL1 and BNL2 which are formed below the trenches TR. At this time, parts of the semiconductor layers BNL1 and BNL2 that are formed below the mask MA are left as the $n^+$-type semiconductor layers NL1 and NL2, respectively.

Figure 8:
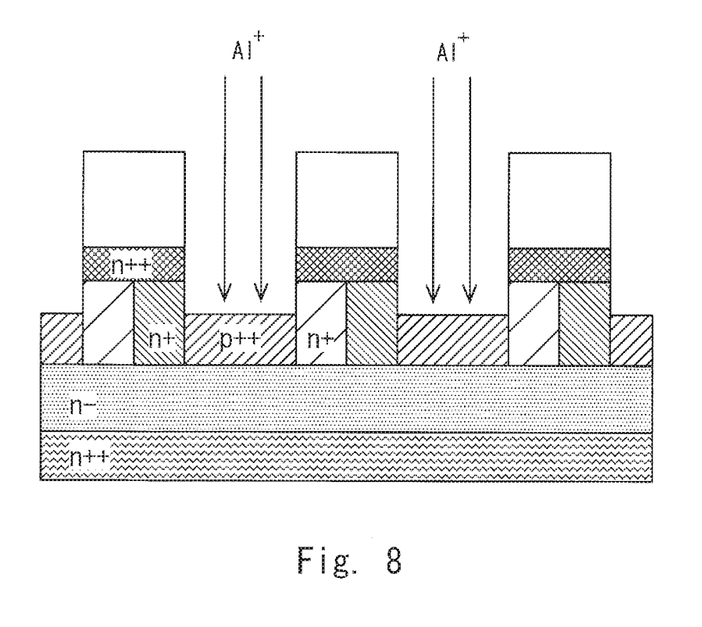
FIG. 8 is a sectional view showing a manufacturing step of the semiconductor device according to the embodiment.

FIG. 8 is a process sectional view when a vertical ion implantation for forming the gate layer GL according to this embodiment is performed.

Further, the mask MA is removed (step S90) and electrodes, wiring layers, and the like are formed (step S100), and then the manufacturing method of the semiconductor device ends.

As described above, in the manufacturing method of the semiconductor device according to this embodiment, the oblique ion implantation and the vertical ion implantation are performed using the same mask MA in steps S60 to S80, thereby making it possible to form the $n^+$-type semiconductor layers NL1 and NL2 which have a substantially predetermined width in the channel forming layer CL below the source layer SL, i.e., which share a region between two gate layers, and are adjacent to each other in a direction crossing a channel.

Accordingly, even if the dimensions of the mask MA vary and the channel width varies due to process variations, the semiconductor layers NL1 and NL2 can be formed to have a substantially predetermined width.

Note that in the semiconductor device according to this embodiment or the manufacturing method of the semiconductor device, the junction FET may have normally-on characteristics or normally-off characteristics.

Further, in the semiconductor device according to this embodiment or the manufacturing method of the semiconductor device, gallium nitride may be used in place of silicon carbide as the material of the substrate and the epitaxial layer.

Furthermore, in the semiconductor device according to this embodiment or the manufacturing method of the semiconductor device, the junction FET may have a configuration in which a gate layer is formed at a side wall of a trench, or may have a configuration in which no trench is formed.

As described above, the semiconductor device according to this embodiment includes the first-conductivity-type semiconductor substrate SUB serving as the drain layer DL; the first-conductivity-type epitaxial layer EP formed on the semiconductor substrate SUB; the first-conductivity-type source layer SL formed on the surface part of the epitaxial layer EP; the second-conductivity-type two gate layers GL formed on the surface part of the epitaxial layer EP so as to sandwich the source layer SL; the first-conductivity-type channel forming layer CL formed so as to be sandwiched between the two gate layers GL, the first-conductivity-type channel forming layer CL being formed on an inner side of the source layer SL in the epitaxial layer EP; and electrode connected to one of the drain layer DL, the source layer SL, and the gate layer GL. In the channel forming layer CL, the two first-conductivity-type impurity layers NL1 and NL2 each having a substantially predetermined width are formed adjacent to each other in a direction crossing a channel.

In the semiconductor device according to this embodiment, the semiconductor substrate SUB and the epitaxial layer EP are preferably made of silicon carbide or gallium nitride.

The manufacturing method of the semiconductor device according to this embodiment includes: steps S10 to S20 of forming the first-conductivity-type epitaxial layer on the first-conductivity-type semiconductor substrate serving as the drain layer; step S30 of forming the first-conductivity-type impurity layer on the surface part of the epitaxial layer; step S40 of forming, on the impurity layer, the mask having openings at positions corresponding to two regions sandwiching the region serving as the source layer, the mask covering the region serving as the source layer; steps S60 to S70 of forming two adjacent first-conductivity-type impurity layers in the epitaxial layer by performing the oblique ion implantation of the first-conductivity-type impurity from two opposite directions via the mask; step S80 of forming two second-conductivity-type gate layers in the impurity layer or the epitaxial layer by performing the vertical ion implantation of the second-conductivity-type impurity via the mask; step S90 of removing the mask; and step S100 of forming a plurality of electrodes to be connected to the drain layer, the source layer, and the gate layer, respectively.

The invention made by the present inventor has been described above with reference to embodiments. The present invention is not limited to the embodiments described above and can be modified in various ways without departing from the gist of the invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
    a first-conductivity-type semiconductor substrate serving as a drain layer;
    a first-conductivity-type epitaxial layer formed on the semiconductor substrate;
    a first-conductivity-type source layer formed in a surface part of the epitaxial layer;
    two second-conductivity-type gate layers formed in the surface part of the epitaxial layer so as to sandwich the source layer;
    a first-conductivity-type channel forming layer formed so as to be sandwiched between the two gate layers, the first-conductivity-type channel forming layer being formed on an inner side of the source layer in the epitaxial layer; and
    an electrode connected to one of the drain layer, the source layer, and the gate layer,
    wherein in the channel forming layer, two first-conductivity-type impurity layers each having a substantially predetermined width are formed adjacent to each other in a direction crossing a channel.

2. The semiconductor device according to claim 1, wherein the semiconductor substrate and the epitaxial layer are made of one of silicon carbide and gallium nitride.

* * * * *